US006645643B2

(12) United States Patent
Zafarana et al.

(10) Patent No.: US 6,645,643 B2
(45) Date of Patent: Nov. 11, 2003

(54) POLYMERIC COMPOSITION FOR PACKAGING A SEMICONDUCTOR ELECTRONIC DEVICE AND PACKAGING OBTAINED THEREFROM

(75) Inventors: Roberto Zafarana, Siracusa (IT); Antonino Scandurra, Catania (IT); Salvatore Pignataro, Aci Castello (IT); Yuichi Tenya, Kawaguki (JP); Akira Yoshizumi, Yokohama (JP)

(73) Assignees: STMicroelectronics S.r.l., Agrate Brianza (IT); Toshiba Chemical Kawaguchi Works, Kawaguchi (JP)

( * ) Notice: Subject to any disclaimer, the term of this patent is extended or adjusted under 35 U.S.C. 154(b) by 0 days.

(21) Appl. No.: 09/844,505

(22) Filed: Apr. 27, 2001

(65) Prior Publication Data

US 2002/0022679 A1 Feb. 21, 2002

(30) Foreign Application Priority Data

Apr. 28, 2000 (EP) .......................... 00830320

(51) Int. Cl.⁷ ............................... H01L 29/12
(52) U.S. Cl. ................ 428/620; 257/787; 257/788; 257/791; 257/793; 257/794; 523/400; 523/443; 523/456; 523/466; 525/476
(58) Field of Search ................ 257/787, 788, 257/791, 793, 794; 428/620; 523/400, 443, 456, 466; 525/476

(56) References Cited

U.S. PATENT DOCUMENTS 4,376,174 A   3/1983   Itoh et al. .................. 523/456

FOREIGN PATENT DOCUMENTS

| DE | 42 16 680 | 11/1992 | ........... C08L/63/00 |
| DE | 198 00 178 | 7/1998 | ........... C08L/63/00 |
| EP | 0 294 013 | 12/1988 | ........... C09D/3/58 |
| EP | 0 421 390 | 4/1991 | ........... C08G/59/40 |
| JP | 10-324791 | * 12/1998 | |

OTHER PUBLICATIONS

Patent abstracts of Japan, vol. 012, No. 070 dated Sep. 14, 1987. Publication No. 62 209126. Applicant: Toshiba Corp.

Patent abstracts of Japan, vol. 008, No. 187 dated May 11, 1984. Publication No. 59 081328. Applicant: Nitto Penki Kogyo KK.

* cited by examiner

*Primary Examiner*—Robert Dawson
*Assistant Examiner*—D. Aylward
(74) *Attorney, Agent, or Firm*—Lisa K. Jorgenson; Allen, Dyer, Doppelt, Milbrath & Gilchrist, P.A.

(57) ABSTRACT

A polymeric composition for making semiconductor device packaging includes at least one epoxy resin, at least one curing agent in an amount between 30 and 110 parts by weight per 100 parts by weight of the epoxy resin, at least one silica-based reinforcing filler in an amount between 300 and 2300 parts by weight per 100 parts of the epoxy resin, and at least one control agent for a rheology of the polymeric composition. The at least one control agent may be substantially free from polar groups and present in an amount between 0.1 and 50 parts by weight per 100 parts by weight of the epoxy resin. The invention also relates to a plastic packaging material for microelectronic applications which may be obtained from the above polymeric composition, and to a semiconductor electronic device including such packaging material.

35 Claims, 5 Drawing Sheets ortho-cresol novolac epoxy resin

*FIG. 1A.*
*(PRIOR ART)* bisphenol A epoxy resin

*FIG. 1B.*
*(PRIOR ART)* phenol-aralkyl epoxy resin

*FIG. 1C.*
*(PRIOR ART)* dicyclopendadiene epoxy resin

*FIG. 1D.*
*(PRIOR ART)* biphenyl type epoxy resin

*FIG. 1E.*
*(PRIOR ART)* alicyclic epoxy resin

*FIG. 1F.*
*(PRIOR ART)* heterocyclic epoxy resin

*FIG. 1G.*
*(PRIOR ART)* halogenated epoxy resin

*FIG. 1H.*
*(PRIOR ART)* polyfunctional epoxy resin / multifunctional epoxy resin

*FIG. 1I.*
*(PRIOR ART)* linear aliphatic epoxy resin

*FIG. 1J.*
*(PRIOR ART)* glycidyl ester type epoxy resin

FIG. 1K.
*(PRIOR ART)* glycidyl amine type epoxy resin

FIG. 1L.
*(PRIOR ART)* phenol-novolac resin

*FIG. 2A.*
*(PRIOR ART)* cresol-novolac resin

*FIG. 2B.*
*(PRIOR ART)* bisphenol A resin

*FIG. 2C.*
*(PRIOR ART)* phenol-aralkyl resin

*FIG. 2D.*
*(PRIOR ART)* dicyclopendadiene phenolic resin

*FIG. 2E.*
*(PRIOR ART)* biphenyl type phenolic resin

POLYMERIC COMPOSITION FOR PACKAGING A SEMICONDUCTOR ELECTRONIC DEVICE AND PACKAGING OBTAINED THEREFROM

FIELD OF THE INVENTION

The present invention relates to the field of semiconductor devices, and, more particularly, to a polymeric composition for packaging an electronic semiconductor device. Moreover, the present invention also relates to a plastic packaging material for microelectronic applications, which may be obtained from such polymeric composition, and to a semiconductor device including such packaging material.

BACKGROUND OF THE INVENTION

In the field of microelectronics, it is quite common to encapsulate electronic semiconductor devices, such as power metal oxide semiconductor (MOS) devices, within packages of plastic material. Power MOS electronic devices include a plurality of layers having different chemical structures (e.g., dissipating elements, support frames, die made from semiconductor materials, and plastic packaging materials) whose compatibility determines the performance and reliability of the device.

The reliability of a power device may be measured by a number of tests. In particular, the so-called High Temperature Reverse Bias (HTRB) test allows reliability to be estimated by subjecting the device to high temperatures during reverse biasing. The behavior of the device in this test depends upon the physical-chemical conditions of the circuit die and the interactions with the packaging material.

Usually, plastic packaging material is produced by hardening a polymeric composition including a thermosetting resin and various additives, such as reinforcing fillers based on fused or crystalline silica, for example, and at least one control agent for the rheology of the polymeric composition (generally based on siloxanes). The thermosetting resin usually includes an epoxy resin that is typically obtained from an epoxy pre-cured with phenolic resin or an epoxy pre-cured with an anhydride.

It has been suggested that to have a low ionic content and a high volume resistivity the bulk characteristics of the plastic packaging material of a semiconductor device may require alteration. For example, it has been suggested that the amount of ions, among which Na+ and Br– ions come from raw materials, be reduced to provide a high volume resistivity, preferably higher than $1 \times 10^{12}$ Ωcm. However, the reliability value obtained by subjecting semiconductor devices of the prior art to the HTRB test is inadequate compared to the ever increasing reliability level required from such devices, particularly from power devices.

SUMMARY OF THE INVENTION

An object of the invention is to provide a polymeric composition for packaging a semiconductor electronic device that provides improved reliability of the semiconductor device with respect to prior art devices.

Applicants have determined that to address the above problem it will not suffice simply to alter the bulk characteristics of the die packaging to provide low ionic concentration and a high volume resistivity. Rather, it may be necessary to reduce the polarity of the plastic packaging material layer as much as possible at the interface with the die itself. In fact, applicants have found that the polarity characteristics at the interface between adjoining layers significantly affect the mechanical and electrical performance of the device.

According to the invention, the above technical problem is solved by a polymeric composition including at least one epoxy resin, at least one curing agent in an amount between 30 and 110 parts by weight per 100 parts by weight of epoxy resin, at least one silica-based reinforcing filler in an amount between 300 and 2300 parts by weight per 100 parts by weight of epoxy resin, and at least one control agent for the rheology of the polymeric composition. The at least one control agent may be substantially free from polar groups and may be present in an amount between 0.1 and 50 parts by weight per 100 parts by weight of epoxy resin.

From tests conducted by applicants, the electrical behavior of the interface plastic package material and the semiconductor material die was found to be substantially correlated to the quantity of polar groups existing at the interface. In particular, it was found that a reduction in the quantity of polar groups at the interface, in particular those coming from the control agent for the rheology, provides significant improvement in the reliability of the semiconductor device.

The at least one epoxy resin may be selected from the group including bisphenol A type epoxy resin, phenol-novolac type epoxy resin, creosol-novolac type epoxy resin, glycidyl ester type epoxy resin, biphenyl type epoxy resin, polyfunctional epoxy resin, glycidyl amine type epoxy resin, linear aliphatic epoxy resin, alicyclic epoxy resin, heterocyclic epoxy resin, halogenated epoxy resin, and mixtures thereof. The chemical structures of these resins may be seen in FIGS. 1A to 1L.

Additionally, the epoxy resin may include a concentration of chlorine ions lower than 10 ppm and a concentration of chlorine in hydrolyzed form lower than 0.1% by weight, because such ions may cause electronic failures. Preferred epoxy resins include those of the glycidyl ester type and novolac type epoxy resins, the novolac type including 170 to 300 epoxy equivalents. These provide good workability during molding and also good electronic reliability.

The at least one curing agent may be a phenolic resin selected from the group including phenol-novolac resin, cresol-novolac resin, bisphenol A resin, phenol-aralkyl resin, dicyclopentane phenolic resin, bisphenyl type phenolic resin, polyfunctional phenolic resin, other denatured phenolic resins, and mixtures thereof. The chemical structures of these resins may be seen in FIGS. 2A to 2F.

Advantageously, the epoxy resin and the phenolic resin may be mixed so that the ratio between the number of epoxy equivalents of the epoxy resin and the number of equivalents of the hydroxyl groups of the phenolic resin is between 0.5 and 1.5. It has been determined that if this ratio exceeds the above defined range, the mechanical strength of the cured epoxy resin may be reduced.

The silica-based reinforcing filler may include fused silica powder or crystalline silica. The silica powder may generally assume a spherical, lumpy or fibrous shape. Spherical silica is generally used in combination with other fillers which have non-uniform diameters. The silica-based reinforcing filler is incorporated in the polymeric composition to adequately protect the semiconductor device and to impart improved workability to the polymeric packaging composition during molding. This, in turn, reduces strain in the device itself.

The silica-based reinforcing filler may include spherical silica in an amount between 0.05 and 20% by weight of the total amount of silica-based reinforcing filler.

Advantageously, spherical silica provides improved flow of the polymeric composition. In particular, spherical silica reduces the so-called resin-flush phenomenon, i.e., when part of the polymeric packaging composition comes out from the air spaces between the various sections of the mold. The spherical silica preferably has an average particle diameter between 0.3 and 1.5 $\mu$m and a surface area between 3 and 10 $m^2g^{-1}$.

In particular, it was found that if the surface area value falls below 2 $m^2g^{-1}$, the so-called resin-flush phenomenon cannot be reduced sufficiently. On the other hand, if the surface area value exceeds $10m^2g^{-1}$, an undesired moisture absorption by the polymeric composition may take place.

Furthermore, the polymeric composition of the invention may further include at least one silica coupling agent suitable for reacting with the surface hydroxyl groups of silica. Advantageously, the coupling agent performs the function of coupling the silica-based reinforcing filler to the polymeric matrix upon prior reaction with the epoxy polar groups including the same. In this way, as the bond takes place in corresponding polar groups existing in the polymeric matrix, the number of free epoxy groups, and decreases further reduction in the polarity of the polymeric composition at the interface with the semiconductive material die ensues. This results in a further advantageous increase in the reliability of the device.

By way of example, the silica-coupling agent may be an amino-silane agent including secondary amino groups having the following structural formula:

$$\text{R-NHR'Si(OR")}_3 \qquad (I)$$

where:
R=Ph—, $C_nH_{2n+1}$, n=1, 2, . . .
R'=—$(CH_2)_m$—, m1, 2, . . .
R"=$C_kH_{2k+1}$, k=1, 2, . . . .

The secondary amino groups of the amino-silane agent do not significantly increase the polarity of the polymeric packaging composition at the interface with the semiconductor material die, which again results in device reliability. The amino-silane agent may be selected from the group including γ-N-methyl amino-propyl triethoxy silane, γ-N-ethyl amino-propyl triethoxy silane, γ-N-phenyl amino-propyl triethoxy silane, γ-N-phenyl amino-propyl trimethoxy silane, N,N-bis [methylidiethoxysilyl)propyl] amine, N,N-bis[γ-(trimethoxysilyl)propyl]amine, and mixtures thereof. Moreover, the amino-silane agent may be included in an amount between 0.05 and 3% by weight of the total amount of silica-based reinforcing filler.

In fact, it has been observed that when the amount of amino-silane coupling agent falls below 0.05% by weight of the total amount of the silica-based reinforcing filler, silica is not sufficiently coupled to the polymeric matrix. As a result, the packaging has poor homogeneity and is fragile. Further, along with the resin-flush phenomenon a so-called resin-bleeding may appear, i.e., resin and silica-based reinforcing filler coming out from the air spaces of the mold, resulting in undesired product loss. In this condition, silica may even show a particular moisture permeability.

Conversely, when the amount of amino-silane coupling agent exceeds 3% by weight of the total amount of silica-based reinforcing filler, the portion of the amino-silane coupling agent that has not reacted is segregated at the interface. This may cause, on the one hand, an increase in polar groups corresponding to the interface itself and, on the other hand, dirtying of mold surfaces.

The control agent for the rheology of the polymeric composition may be substantially free from polar groups. Preferably, the control agent for the rheology of the polymeric composition is polydimethylsiloxane substantially free from polyoxyalkylenether groups having the following structural formula:

$$[\text{Si}(CO_3)_2\text{—O}]_n \qquad (II)$$

a viscosity of which at 25° C. is between 5 and $10^6$ $mm^2/s$. Advantageously, polydimethylsiloxane acts effectively on the rheology of the polymeric composition and can improve the workability of the polymeric composition. The control agent for the rheology of the polymeric composition may be added in an amount between 1 and 5% by weight to the total amount of amino-silane coupling agent.

The polymeric composition may further include ingredients known in the art such as catalysts (e.g., imidasole and derivatives thereof, derivatives of tertiary amines, phosphines or derivatives thereof), releasing agents (e.g., natural waxes, synthetic waxes, metal salts of linear aliphatic acids, esters or acid amides and paraffins), flame-retardant agents (e.g., bromotoluene, hexabromobenzene and antimony oxide, coloring agents such as carbon black), impact modifiers (e.g., silicone rubber and butadiene rubber), and other common additives. Further, the polymeric composition of the invention may be prepared according to conventional mixing operations using mixing apparatuses also known in the art. At the end of the conventional mixing operations, the polymeric composition is cooled, ground to a powder, and then pressed into pellet form.

Plastic packaging material for microelectronic applications is also provided according to the invention. The plastic packaging material may be obtained by molding and curing the above described polymeric composition.

Encapsulation of a semiconductor device may be carried out by submitting the polymeric composition to conventional molding operations, such as compression molding, transfer molding, or injection molding, for example. Preferably, the molding operations are performed by a low-pressure transfer molding technique. The molding operation may be performed in steps. The first step may include injecting a molding compound inside the mold for two minutes, during which the vast amount of the polymer is cured. The second step includes post mold curing in oven at 150–190° C. in $N_2$ completing the curing process.

A semiconductor electronic device is also provided according to the invention and includes at least one electronic circuit mounted on a frame and a package of plastic material on the electronic circuit. The package may be obtained by molding and hardening the above described polymeric composition. Semiconductor electronic devices according to the invention may include, but are not limited to, power devices or power packages, integrated circuits (IC), large scale integrated circuits (LSI), bipolar devices and MOS, thyristor devices, diodes and memory devices.

BRIEF DESCRIPTION OF THE DRAWINGS

Further characteristics and advantages of the invention will be more apparent from the following description of an embodiment, given solely by way of non-limitative example, with reference to the attached drawings, in which.

DETAILED DESCRIPTION OF THE PREFERRED EMBODIMENTS

Figure 1A:
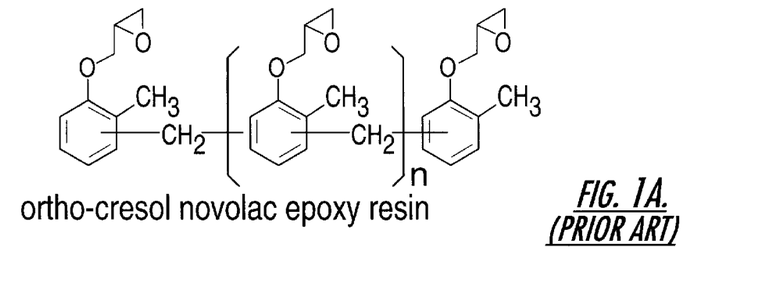
FIGS. 1A to 1L and 2A to 2F are molecular diagrams illustrating chemical structures of prior art resins.
Figure 1B:
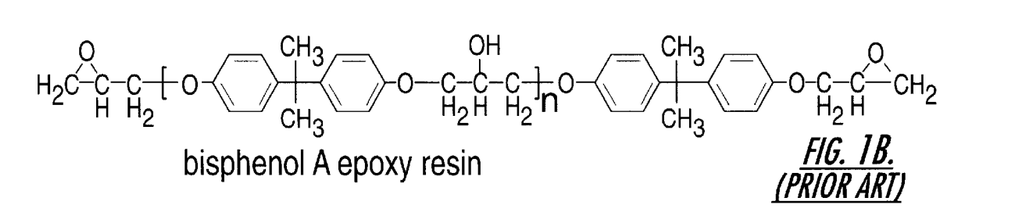
Figure 1C:
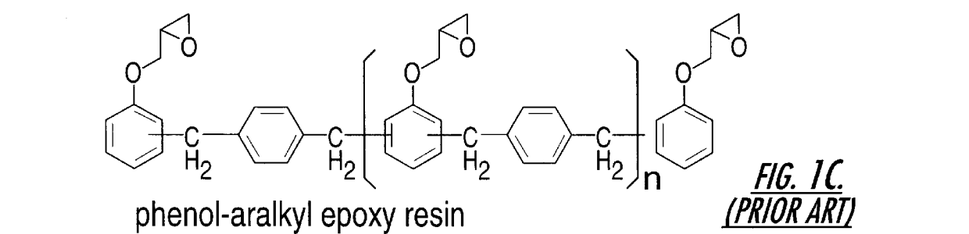
Figures 1D, 1E:
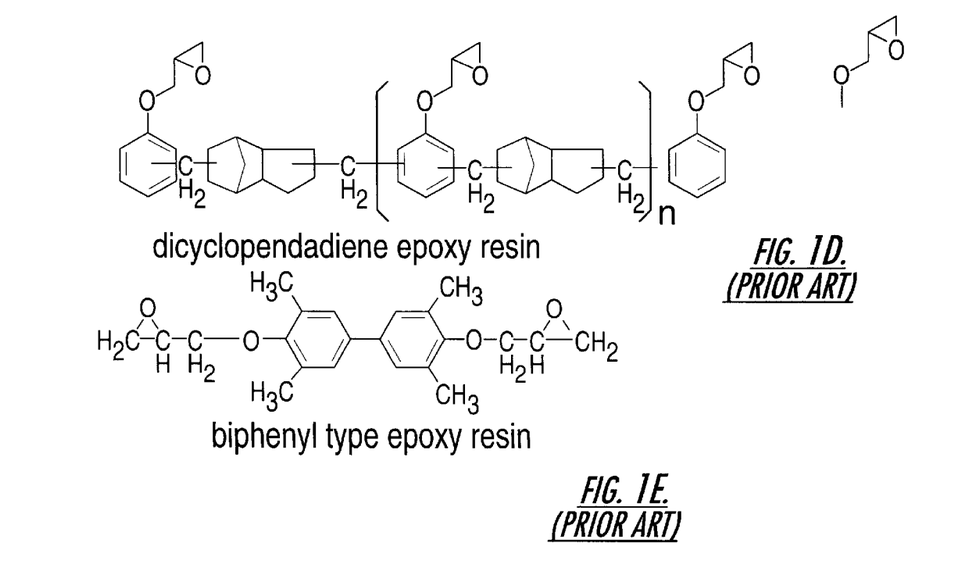
Figure 1F:
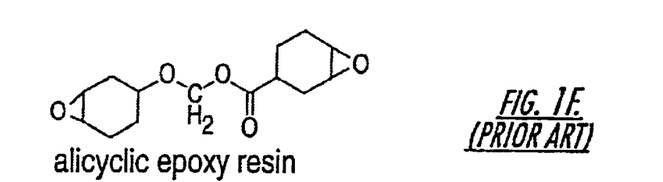
Figure 1G:
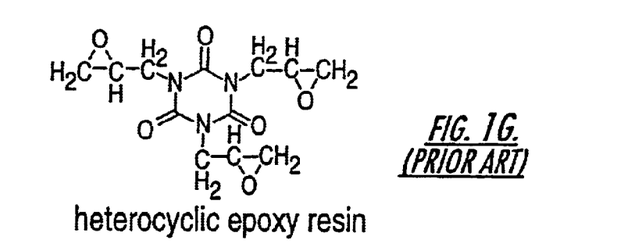
Figure 1H:
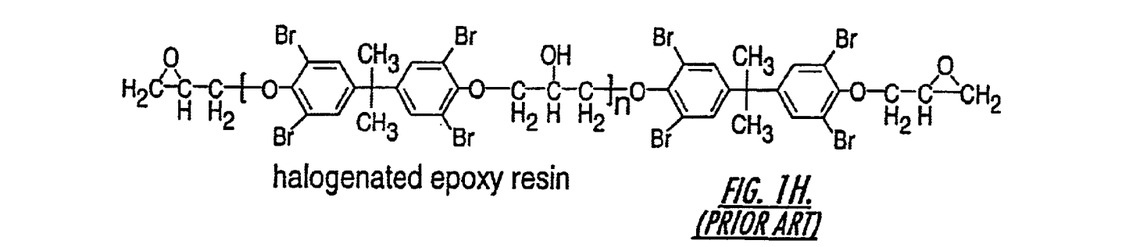
Figure 1I:
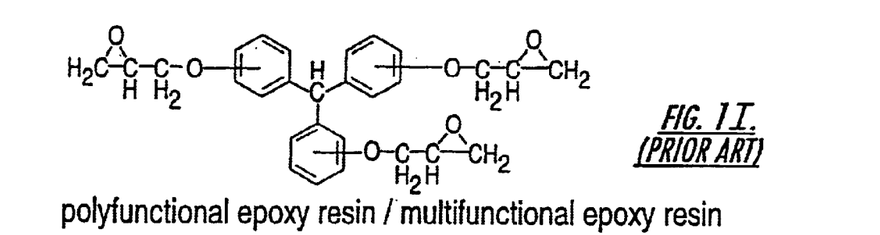
Figure 1J:
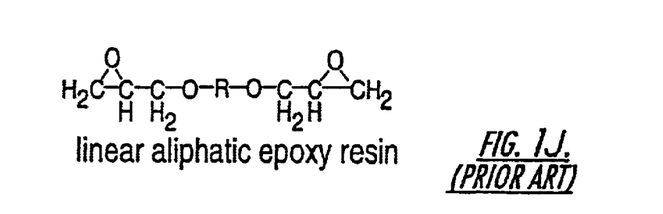
Figure 1K:
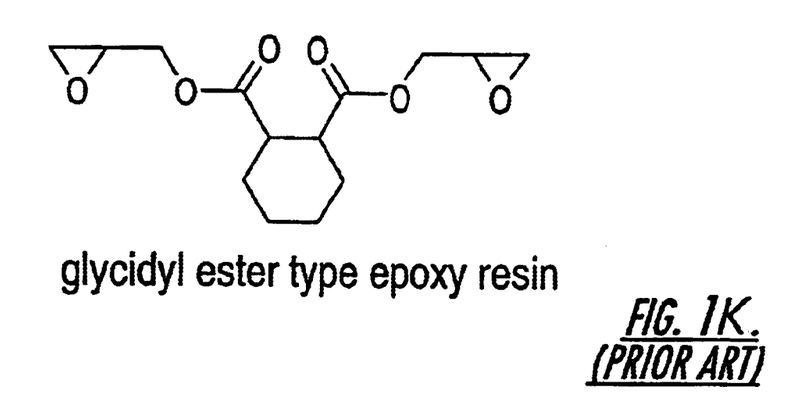
Figure 1L:
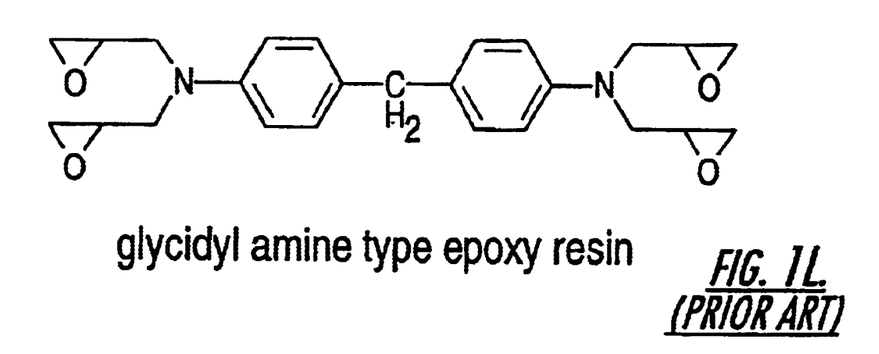
Figure 2A:
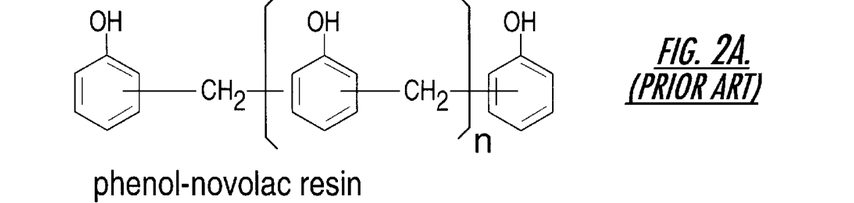
Figure 2B:
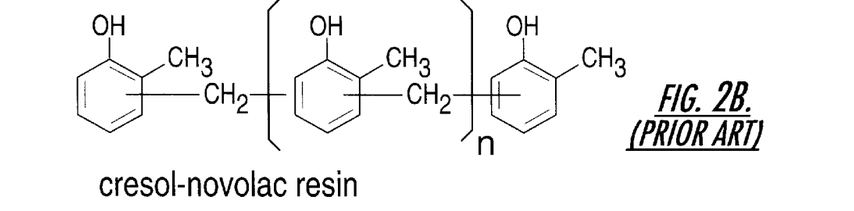
Figure 2C:
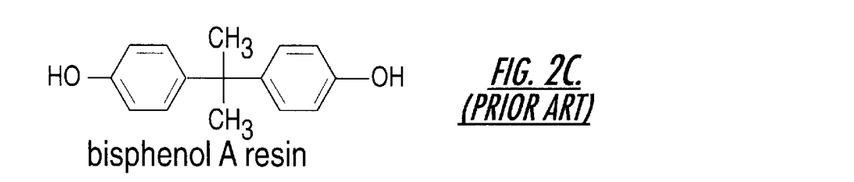
Figure 2D:
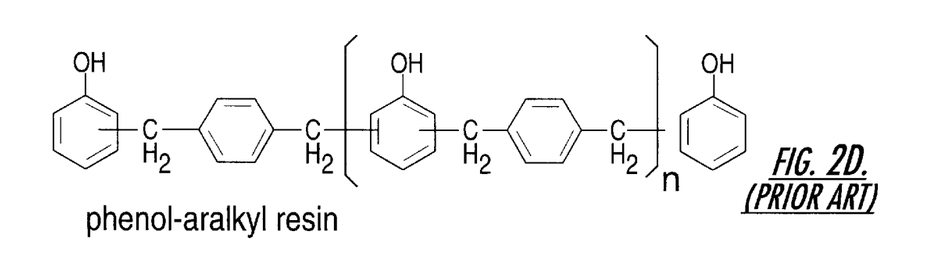
Figure 2E:
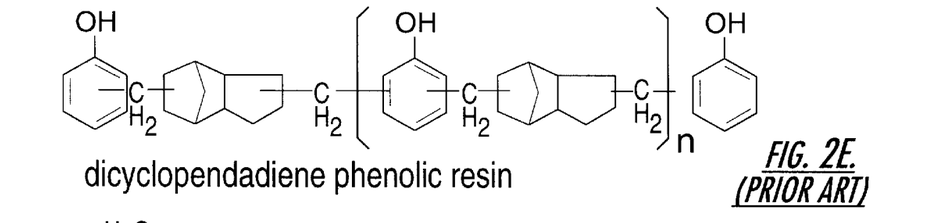
Figure 2F:
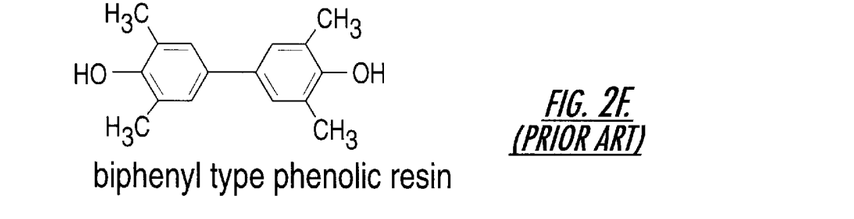
Figure 3:
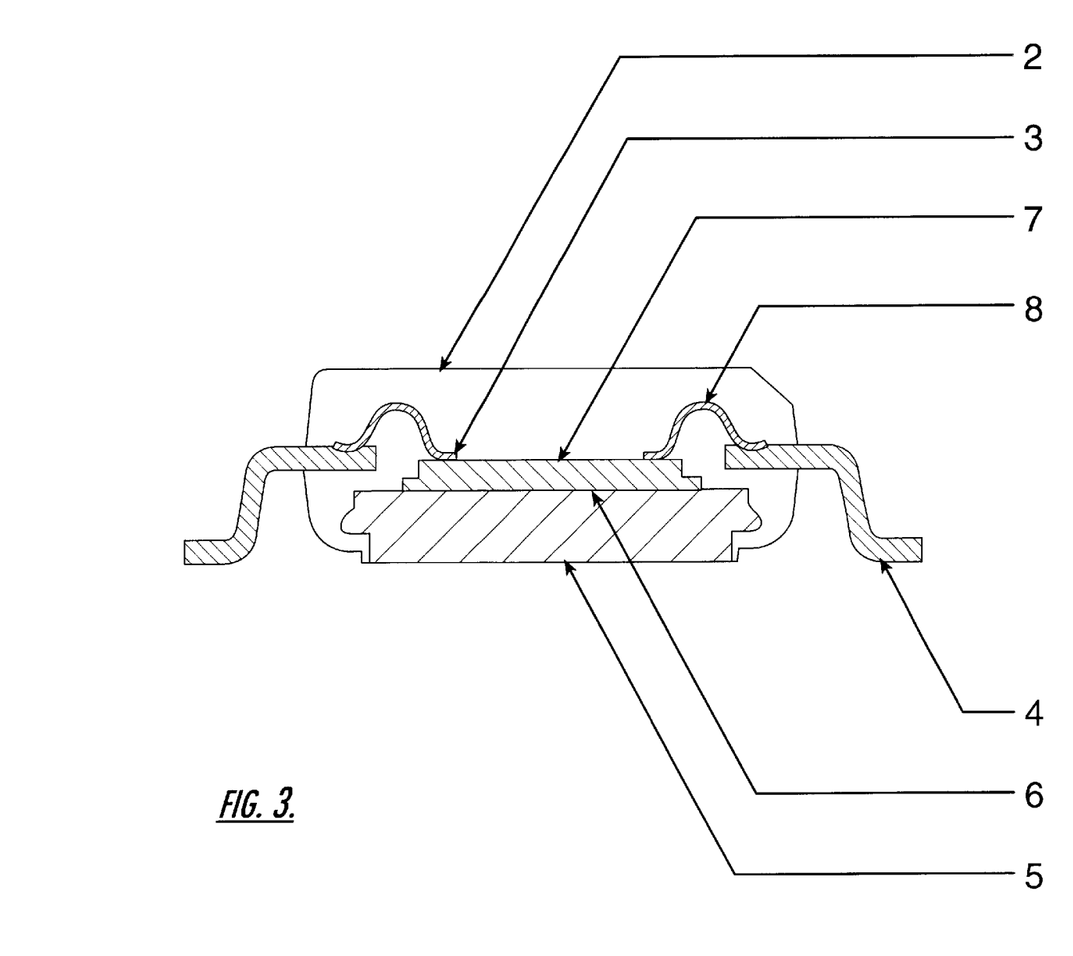
FIG. 3 is a cross-sectional view of a semiconductor package according to the invention.

Turning now to FIG. 3, a power package 1 according to the invention is now described. The package 1 includes plastic packaging 2, at least one semiconductor integrated electronic circuit within the packaging and mounted on a supporting metal frame 4, and a heat dissipating element 5 contacting the circuit. The dissipating element 5 protrudes from the packaging of plastic material 2. The frame 4 may be a thin metal foil, for example.

The integrated circuit is implemented on a die 7 of semiconductor material attached to the heat dissipating element 5 by a soft solder alloy 6. Several connectors are formed on frame 4 (e.g., contact pins, not shown) which, once the production process has ended, allow for the assembly and connection of the semiconductor circuit to a pre-printed board, for example. With respect to the die 7, pre-fixed contact points 3 are provided to which lead to the terminals of the circuit structure. Thin metal wires 8 are connected between the contact points 3 and the internal ends of the corresponding contact pins.

With reference to the above description, what follows are preferred examples of polymeric compositions according to the invention which are particularly suitable for a polymer packaging layer of a MOS power package.

EXAMPLE 1

Invention

In a Henschel™ type mixer, fused silica powder, antimony trioxide powder, and carbon black powder were added in a first step. Afterwards, a silane coupling agent, an impact modifier (e.g., a silicon rubber or a butadiene rubber), a control agent for the rheology of the polymeric composition (e.g., polysiloxane), and other conventional additives such as natural and synthetic waxes, elastomers, flame-retardants were added to the polymeric composition thus obtained.

In a second step, the polymeric composition was mixed at room temperature to disperse silica homogeneously. The epoxy resin and the phenolic resin were later added to the polymeric composition. The resulting polymeric composition was made homogeneous in a biaxial heating roll, cooled, ground to powder, and pressed into pellet form. In this way a polymeric composition was obtained having the composition shown in the Table I, below.

EXAMPLES 2–5

Invention

In the same way as the preceding Example 1, four more polymeric compositions according to the invention were prepared, whose compositions are shown in Table I.

EXAMPLES 6–7

Composition

To compare the polymeric compositions according to the present invention with those of the prior art, two polymeric comparative compositions were prepared in the same way as the preceding Example 1, the compositions of which are shown in Table I.

EXAMPLE 8

Workability

The polymeric compositions of the invention (Examples 1–5) and those of the comparison examples (Examples 6–7) were subjected to a set of tests to evaluate their workability characteristics. In particular, some samples of the polymeric compositions were subjected to a test for determining the flowability of the resin during molding—the so-called "spiral flow"—carried out according to standards based on Toshiba Internal Method TM-C7703. This test requires a predetermined amount of resin (i.e., 20 g) at a temperature between 170 and 175° C. to flow through a spiral-shaped duct under the thrust of an applied pressure of 100 kg/cm$^2$. Thereafter, the distance covered (in cm) in 5±2 sec is measured. Simultaneously, other samples of the above polymeric compositions were submitted to a test for determining the amount of polymeric composition that had come out from air spaces in the mold (i.e., resin flush) was conducted according to standard based on Toshiba Internal Method TM-C7706.

The results from the above tests are shown in the following Table II. It should be noted that the optimum range values depend upon the type of package, molding machine, etc. In light of what has been stressed, the results of Table II show that the polymeric composition of the invention of Example 1 is preferable from the standpoint of workability. The enhanced workability of the composition of Example 1 results from the effect of the secondary amino-silane, since it includes neither polysiloxane nor spherical silica.

Moreover, the silane of the composition in Example 1 is more effective than the silica of the composition in Example 2. This is the reason for the diminished results with respect to resin flush. However, without spherical silica in the composition of Example 2, the resin flush may be even worse. In contrast to composition 1, composition 3 includes polysiloxane, which improves workability during pelletizing process. However, as it is known, polydimethylsiloxane generally exhibits worse flowability.

With respect to the composition of Example 5, the composition of Example 2 does not include polyethers, but it includes spherical silica. Due to the effect of aminosilane and polyethers, the resin flush value is below the optimum range. Ideally, the flush value should be zero.

EXAMPLE 9

Reliability of the Device

To evaluate the reliability of a semiconductor electronic device, several power devices were constructed that included semiconductor circuits formed using the compositions of the invention (Examples 1–5) as well as the comparison compositions (Examples 6–7). Such devices were then tested using the HTRB test described above. This testing was conducted in accordance with the MIL-STD-750D standards, Method no. 1048. According to these standards, the device is reverse biased at 80% of the breakdown voltage, with the gate and source short-circuited, at a temperature of 150° C. for a predetermined time. In particular, three test times were selected, namely 168, 500, and 1000 hours.

Table III (below) shows the number of damaged devices for a total of 10 examined devices relative to the three test times. The results of Table III clearly show that the compositions of the invention can improve the reliability of the devices compared to the conventional compositions. In particular, for the compositions of Examples 1, 3 and 5, no breakdowns were found in the tested devices, even after 1000 test hours.

Additionally, the test was repeated on a second lot of ten devices packaged with the polymer comparative composition of Example 6. Yet, in so doing, the non-reproducibility of the results was demonstrated. In particular, while in the first case the results shown in Table III were obtained, in the second case the test resulted in the breakdown of all of the devices tested for each of the three test times.

TABLE I

| Raw Material (% by weight) | Ex 1 | Ex 2 | Ex 3 | Ex 4 | Ex 5 | Ex 6 | Ex 7 |
|---|---|---|---|---|---|---|---|
| ortho-cresol novolac type epoxy resin | 12 | 12 | 12 | 8 | 12 | 12 | 8 |
| bromined bishenol-A type epoxy resin | 3 | 3 | 3 | 2 | 3 | 3 | 2 |
| novolac type phenolic resin | 7 | 7 | 7 | 5 | 7 | 7 | 5 |
| γ-(N-phenylamino) propyl trimethoxy silane | 0.5 | 0.25 | 0.5 | 0.4 | 0.5 | 0 | 0 |
| fine spherical fused silica | 0 | 5 | 0 | 1.5 | 0 | 0 | 0 |
| fused silica | 72 | 67 | 72 | 0 | 72 | 72 | 0 |
| crystalline silica | 0 | 0 | 0 | 80 | 0 | 0 | 81 |
| poly dimethyl siloxane | 0 | 0.25 | 0.25 | 0.4 | 0.25 | 0 | 0 |
| poly dimethyl siloxane with poly oxylkylated ether group | 0 | 0 | 0 | 0 | 0.001 | 0.3 | 0.4 |
| other additives (including catalyst, waxes, coloring agents) | 5.5 | 5.5 | 5.25 | 2.7 | 5.25 | 5.7 | 3.6 |

TABLE II

| Workability | Ex 1 | Ex 2 | Ex 3 | Ex 4 | Ex 5 | Ex 6 | Ex 7 |
|---|---|---|---|---|---|---|---|
| Spiral flow (cm) | 96 | 96 | 69 | 33 | 99 | 102 | 32 |
| Resin flush (mm) (10 μm) thickness slit) | 1.0 | 2.0 | 2.0 | 1.6 | 0.8 | 2.0 | 4.8 |

TABLE III

| Molding Compound | Number of failed devices on 10 tested devices at: | | |
|---|---|---|---|
| | 168 hours | 500 hours | 1000 hours |
| Ex. 1 | 0 | 0 | 0 |
| Ex. 2 | 0 | 1 | 3 |
| Ex. 3 | 0 | 0 | 0 |
| Ex. 4 | 0 | 3 | 5 |
| Ex. 5 | 0 | 0 | 0 |
| Ex. 6 | 0 | 2 | 4 |
| Ex. 7 | 10 | 10 | 10 |

That which is claimed is:

1. A polymeric composition for making semiconductor device packaging comprising:
   at least one epoxy resin;
   at least one curing agent in an amount of about 30 to 110 parts by weight per 100 parts by weight of said at least one epoxy resin;
   at least one silica-based reinforcing filler in an amount of about 300 to 2300 parts by weight per 100 parts of said at least one epoxy resin; and
   at least one control agent for controlling the rheology of the polymeric composition in an amount of about 0.1 to 50parts by weight per 100 parts by weight of said at least one epoxy resin, said at least one control agent being substantially free from polar groups.

2. The polymeric composition according to claim 1 wherein said at least one epoxy resin is selected from the group consisting of bisphenol A type epoxy resin, phenol-novolac type epoxy resin, cresol-novolac type epoxy resin, glycidyl ester type epoxy resin biphenyl type epoxy resin, polyfunctional epoxy resin, glycidyl amine type epoxy resin, linear aliphatic epoxy resin, alicyclic epoxy resin, heterocyclic epoxy resin, halogenated epoxy resin, and mixtures thereof.

3. The polymeric composition according to claim 1 wherein said at least one curing agent comprises a phenolic resin.

4. The polymeric composition according to claim 3 wherein said phenolic resin is selected from the group consisting of phenol-novolac resin, cresol-novolac resin, bisphenol A resin, phenol-aralkyl resin, dicyclopentadiene phenolic resin, bisphenyl type phenolic resin, polyfunctional phenolic resin, and mixtures thereof.

5. The polymeric composition according to claim 1 wherein said at least one silica-based reinforcing filler comprises spherical silica in an amount of about 0.05% to 20% by weight of a total amount of said at least one silica-based reinforcing filler.

6. The polymeric composition according to claim 5 wherein said spherical silica have an average particle diameter of about 0.3 to 1.5 μm and a surface area of about 2 to 10 $m^2g^{-1}$.

7. The polymeric composition according to claim 1 further comprising at least one silica-coupling agent for reacting with said at least one epoxy resin.

8. The polymeric composition according to claim 7 wherein said at least one silica-coupling agent comprises an amino-silane agent; and wherein said amino-silane agent comprises secondary amino groups having the following structural formula;

R-NHR'Si(OR")₃ where R comprises at least one Ph— and an alkyl group; R' comprises an alkylene group; and R" comprises an alkyl group.

9. The polymeric composition according to claim 8 wherein said amino-silane agent is selected from the group consisting of γ-N-methyl amino-propyl triethoxy silane, γ-N-ethyl amino-propyl triethoxy silane, γ-N-phenyl amino-propyl triethoxy silane, γ-N-phenyl amino-propyl trimethoxy silane, N,N-bis[(methyldimethoxysilyl)propyl]amine, N,N-bis[γ-(trimethoxysilyl)propyl]amine, and mixtures thereof.

10. The polymeric composition according to claim 8 wherein said amino-silane agent is present in an amount of about 0.05% to 3% by weight of a total weight of said silica-based reinforced filler.

11. The polymeric composition according to claim 8 wherein said at least one control agent is present in an amount of about 1% to 5% by weight of said amino-silane agent.

12. The polymeric composition according to claim 1 wherein said at least one control agent comprises polydimethylsiloxane substantially free from polyoxyalkylenether groups.

13. A polymeric composition for making semiconductor device packaging comprising:
   at least one epoxy resin;
   at least one curing agent in an amount of about 30 to 110 parts by weight per 100 parts by weight of said at least one epoxy resin, said at least one curing agent comprising a phenolic resin;
   at least one silica-based reinforcing filler in an amount of about 300 to 2300 parts by weight per 100 parts of said at least one epoxy resin, said at least one silica-based reinforcing filler comprising spherical silica; and at least one control agent for controlling the rheology of the polymeric composition in an amount of about 0.1 to 50 parts by weight per 100 parts by weight of said at least one epoxy resin, said at least one control agent being substantially free from polar groups.

14. The polymeric composition according to claim 13 wherein said at least one epoxy resin is selected from the group consisting of bisphenol A type epoxy resin, phenol-novolac type epoxy resin, cresol-novolac type epoxy resin, glycidyl ester type epoxy resin, biphenyl type epoxy resin, polyfunctional epoxy resin, glycidyl amine type epoxy resin, linear aliphatic epoxy resin, alicyclic epoxy resin, heterocyclic epoxy resin, halogenated epoxy resin, and mixtures thereof.

15. The polymeric composition according to claim 13 wherein said phenolic resin is selected from the group consisting of phenol-novolac resin, cresol-novolac resin, bisphenol A resin, phenol-aralkyl resin, dicyclopentadiene phenolic resin, bisphenyl type phenolic resin, polyfunctional phenolic resin, and mixtures thereof.

16. The polymeric composition according to claim 13 wherein said spherical silica is present in an amount of about 0.05% to 20% by weight of a total amount of said at least one silica-based reinforcing filler.

17. The polymeric composition according to claim 16 wherein said spherical silica have an average particle diameter of about 0.3 to 1.5 $\mu$m and a surface area of about 2 to 10 $m^2 g^{-1}$.

18. The polymeric composition according to claim 13 further comprising at least one silica-coupling agent for reacting with said at least one epoxy resin.

19. The polymeric composition according to claim 18 wherein said at least one silica-coupling agent comprises an amino-silane agent; and wherein said amino-silane agent comprises secondary amino groups having the following structural formula:

R-NHR'Si(OR")$_3$ where R comprises at least one Ph— and an alkyl group; R'comprises an alkylene group; and R"comprises an alkyl group.

20. The polymeric composition according to claim 19 wherein said amino-silane agent is selected from the group consisting of γ-N-methyl amino-propyl triethoxy silane, γ-N-ethyl amino-propyl triethoxy silane γ-N-phenyl amino-propyl triethoxy silane, γ-N-phenyl amino-propyl trimethoxy silane, N,N-bis[(methyldimethoxysilyl)propyl]amine, N,N-bis[γ-(trimethoxysilyl)propyl]amine, and mixtures thereof.

21. The polymeric composition according to claim 19 wherein said amino-silane agent is present in an amount of about 0.05% to 3% by weight of a total weight of said silica-based reinforced filler.

22. The polymeric composition according to claim 19 wherein said at least one control agent is present in an amount of about 1% to 5% by weight of said amino-silane agent.

23. The polymeric composition according to claim 13 wherein said at least one control agent comprises polydimethylsiloxane substantially free from polyoxyalkylenether groups.

24. A semiconductor device comprising:
at least one electronic circuit; and
packaging for said at least one electronic circuit comprising a hardened polymeric composition, the polymeric composition comprising at least one epoxy resin, at least one curing agent in an amount of about 30 to 110 parts by weight per 100 parts by weight of the at least one epoxy resin, at least one silica-based reinforcing filler in an amount of about 300 to 2300 parts by weight per 100 parts of the at least one epoxy resin, and at least one control agent for controlling the rheology of the polymeric composition in an amount of about 0.1 to 50 parts by weight per 100 parts by weight of the at least one epoxy resin, the at least one control agent being substantially free from polar groups.

25. The semiconductor device according to claim 24 wherein the at least one epoxy resin is selected from the group consisting of bisphenol A type epoxy resin, phenol-novolac type epoxy resin, cresol-novolac type epoxy resin, glycidyl ester type epoxy resin, biphenyl type epoxy resin, polyfunctional epoxy resin, glycidyl amine type epoxy resin, linear aliphatic epoxy resin, alicyclic epoxy resin, heterocyclic epoxy resin, halogenated epoxy resin, and mixtures thereof.

26. The semiconductor device according to claim 24 wherein the at least one curing agent comprises a phenolic resin.

27. The semiconductor device according to claim 24 wherein the at least one silica-based reinforcing filler comprises spherical silica in an amount of about 0.05% to 20% by weight of a total amount of the at least one silica-based reinforcing filler.

28. The semiconductor device according to claim 24 further comprising at least one silica-coupling agent for reacting with the at least one epoxy resin.

29. The semiconductor device according to claim 24 wherein the at least one control agent comprises polydimethylsiloxane substantially free from polyoxyalkylenether groups.

30. A method for making packaging for a semiconductor device comprising:
molding a polymeric composition comprising at least one epoxy resin, at least one curing agent in an amount of about 30 to 110 parts by weight per 100 part by weight of the at least one epoxy resin, at least one silica-based reinforcing filler in an amount of about 300 to 2300 parts by weight per 100 parts of the at least one epoxy resin, and at least one control agent for controlling the rheology of the polymeric composition in an amount of about 0.1 to 50 parts by weight per 100 parts by weight of the at least one epoxy resin, the at least one control agent being substantially free from polar groups; and
hardening the polymeric composition to form the packaging.

31. The method according to claim 30 wherein the at least one epoxy resin is selected from the group consisting of bispheno A type epoxy resin, phenol-novolac type epoxy resin, cresol-novolac type epoxy resin, glycidyl ester type epoxy resin, biphenyl type epoxy resin, polyfunctional epoxy resin, glycidyl amine type epoxy resin, linear aliphatic epoxy resin, alicyclic epoxy resin, heterocyclic epoxy resin, halogenated epoxy resin, and mixtures thereof.

32. The method according to claim 30 wherein the at least one curing agent comprises a pbenolic resin.

33. The method according to claim 30 wherein the at least one silica-based reinforcing filler comprises spherical silica in an amount of about 0.05% to 20% by weight of a total amount of the at least one silica-based reinforcing filler.

34. The method according to claim 30 further comprising at least one silica-coupling agent for reacting with the at least one epoxy resin.

35. The method according to claim 30 wherein the at least one control agent comprises polydimethylsiloxane substantially free from polyoxyalkylenether groups.

* * * * *